United States Patent
Jang et al.

(10) Patent No.: US 8,119,901 B2
(45) Date of Patent: Feb. 21, 2012

(54) SOLAR CELL MODULE HAVING A CONDUCTIVE PATTERN PART

(75) Inventors: Daehee Jang, Seoul (KR); Jihoon Ko, Seoul (KR); Juwan Kang, Seoul (KR); Jonghwan Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 12/938,145

(22) Filed: Nov. 2, 2010

(65) Prior Publication Data

US 2011/0100417 A1 May 5, 2011

(30) Foreign Application Priority Data

Nov. 3, 2009 (KR) .................. 10-2009-0105393
Oct. 6, 2010 (KR) .................. 10-2010-0097396

(51) Int. Cl.
*H01L 31/05* (2006.01)
(52) U.S. Cl. ....................................... 136/244
(58) Field of Classification Search ........................ None
See application file for complete search history.

(56) References Cited

U.S. PATENT DOCUMENTS

| 5,268,039 A * | 12/1993 | Vogeli et al. ............... 136/256 |
| 5,538,564 A * | 7/1996 | Kaschmitter .............. 136/255 |
| 2008/0196757 A1 * | 8/2008 | Yoshimine ................ 136/244 |
| 2010/0139740 A1 * | 6/2010 | Xavier et al. .............. 136/251 |

* cited by examiner

*Primary Examiner* — Jeffrey T Barton
*Assistant Examiner* — Magali P Slawski
(74) *Attorney, Agent, or Firm* — Birch, Stewart, Kolasch & Birch, LLP

(57) ABSTRACT

A solar cell module is discussed. The solar cell module includes a plurality of solar cells each including a plurality of first current collectors and a plurality of second current collectors, a first protective layer positioned on incident surfaces of the solar cells, a transparent member positioned on the first protective layer, and a conductive pattern part positioned on non-incident surfaces of the plurality of solar cells. The conductive pattern part includes a first pattern having a plurality of first protrusions connected to first current collectors of one solar cell and a second pattern having a plurality of second protrusions connected to second current collectors of the one solar cell. The plurality of first current collectors and the plurality of second current collectors are positioned on a surface of each solar cell on which light is not incident.

19 Claims, 14 Drawing Sheets

(a)

(b)

(a)

(b)

SOLAR CELL MODULE HAVING A CONDUCTIVE PATTERN PART

This application claims priority to and the benefit of Korean Patent Application Nos. 10-2009-0105393 and 10-2010-0097369 filed in the Korean Intellectual Property Office respectively on Nov. 3, 2009 and Oct. 6, 2010, the entire contents of which are incorporated herein by reference.

BACKGROUND OF THE INVENTION

1. Field of the Invention

Example embodiments of the invention relate to a solar cell module.

2. Description of the Related Art

Recently, as existing energy sources such as petroleum and coal are expected to be depleted, interests in alternative energy sources for replacing the existing energy sources are increasing. Among the alternative energy sources, solar cells generating electric energy from solar energy have been particularly spotlighted. Among solar cells, a back contact solar cell, in which both a terminal for outputting electrons to the outside and a terminal for outputting holes to the outside are formed on a back surface of a substrate (i.e., a surface of the substrate on which light is not incident), has been developed. In the back contact solar cell, a light receiving area is increased, and thus the efficiency of the back contact solar cell is improved.

A panel type solar cell module is manufactured by connecting the plurality of back contact solar cells in series or in parallel to one another, so as to obtain a desired output.

SUMMARY OF THE INVENTION

In one aspect, there is a solar cell module including a plurality of solar cells, each solar cell including a plurality of first current collectors, a plurality of second current collectors, a light incident surface and a non-light incident surface, and the plurality of first current collectors and the plurality of second current collectors being positioned on the light incident surface, a first protective layer positioned on incident surfaces of the plurality of solar cells, a transparent member positioned on the first protective layer, and a conductive pattern part positioned on non-incident surfaces of the plurality of solar cells, the conductive pattern part including a first pattern having a plurality of first protrusions connected to a plurality of first current collectors of at least one solar cell and a second pattern having a plurality of second protrusions connected to a plurality of second current collectors of the at least one solar cell, wherein the plurality of first current collectors of the at least one solar cell are connected to the plurality of first protrusions and the plurality of second current collectors of the at least one solar cell are connected to the plurality of second protrusions by a conductive adhesive part that is positioned between the plurality of first current collectors of the at least one solar cell and the plurality of first protrusions and between the plurality of second current collectors of the at least one solar cell and the plurality of second protrusions.

Each of the first pattern and the second pattern may have a thickness of about 25 μm to 50 μm.

The plurality of first protrusions and the plurality of second protrusions each may have a resistance equal to or less than about 0.01179Ω.

A width of each of the plurality of first protrusions may be substantially equal to a width of each of the plurality of second protrusions. The width of each of the plurality of first protrusions may be different from the width of each of the plurality of second protrusions.

A ratio of an area of the second pattern to an area of the first pattern may be 0.6 to 1:1 to 0.6.

The first pattern and the second pattern may be separated from each other by an insulating material.

The solar cell module may further include a back sheet positioned under the conductive pattern part.

The solar cell module may further include a second protective layer positioned between the plurality of solar cells and the conductive pattern part. The second protective layer may have a plurality of first openings exposing the plurality of first current collectors and the plurality of second current collectors.

The solar cell module may further include an insulating sheet positioned between the second protective layer and the conductive pattern part. The insulating sheet may have a plurality of second openings at a location corresponding to the plurality of first openings.

A width of each of the plurality of first openings may be substantially equal to a width of each of the plurality of second openings. The width of each of the plurality of first openings may be different from the width of each of the plurality of second openings.

The solar cell module may further include a second protective layer positioned between the conductive pattern part and the back sheet.

The solar cell module may further include an insulating sheet positioned between the plurality of solar cells and the conductive pattern part. The insulating sheet may have a plurality of openings exposing the plurality of first current collectors and the plurality of second current collectors. The insulating sheet may further have a plurality of holes formed in a portion where the plurality of openings are not positioned.

The solar cell module may further include an insulating film positioned between the conductive pattern part and the second protective layer.

At least one of the insulating film and the conductive pattern part may have a plurality of holes.

Each of the plurality of first protrusions and the plurality of second protrusions may have a curved edge.

The conductive adhesive part may be formed of a conductive adhesive film, a conductive paste, or a conductive epoxy.

The conductive adhesive film may include a resin and conductive particles distributed in the resin. The resin may be a thermosetting resin. Each of the conductive particles may have a diameter of about 2 μm to 30 μm.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
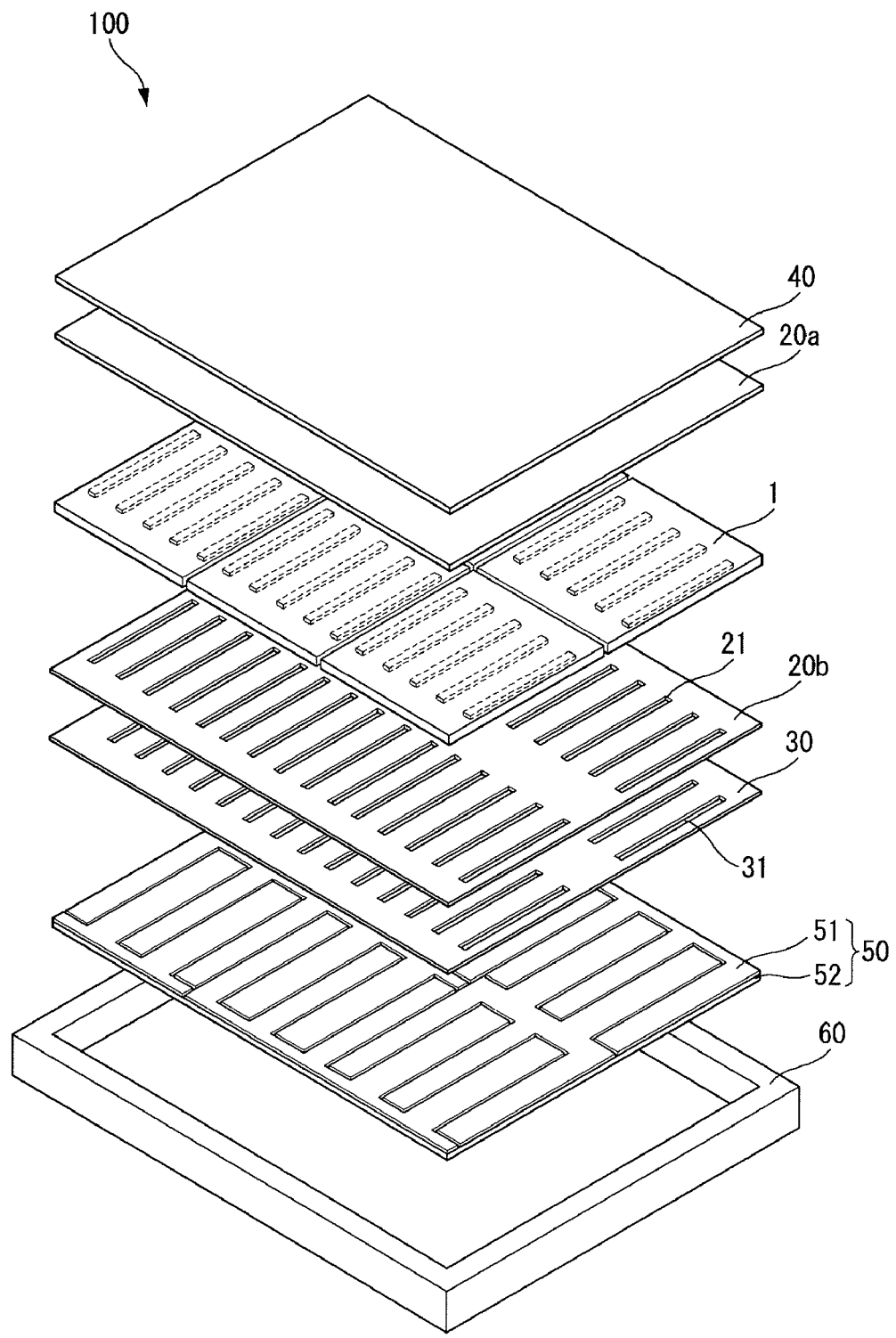
FIG. 1 is a perspective view schematically showing a solar cell module according to an example embodiment of the invention.

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

FIG. 1 is a perspective view schematically showing a solar cell module according to an example embodiment of the invention.

As shown in FIG. 1, a solar cell module 100 according to an example embodiment of the invention includes a plurality of solar cells 1, protective layers 20a and 20b for protecting the solar cells 1, a transparent member 40 on the protective layer 20a (hereinafter, referred to as "upper protective layer") positioned on light receiving surfaces of the solar cells 1, an insulating sheet 30 positioned under the protective layer 20b (hereinafter, referred to as "lower protective layer") positioned on surfaces, opposite the light receiving surfaces, on which light is not incident, a pattern forming part 50 positioned under the insulating sheet 30, and a frame 60 for receiving the above components 1, 20a, 20b, 30, 40, and 50.

The transparent member 40 on the light receiving surface of the solar cell module 100 is formed of a tempered glass having a high transmittance of light to prevent a damage of the solar cell module 100. The tempered glass may be a low iron tempered glass containing a small amount of iron. The transparent member 40 may have an embossed inner surface so as to increase a scattering effect of light.

The upper and lower protective layers 20a and 20b prevent corrosion of metal resulting from moisture penetration and protect the solar cell module 100 from an impact. The upper and lower protective layers 20a and 20b and the plurality of solar cells 1 form an integral body when a lamination process is performed in a state where the upper and lower protective layers 20a and 20b are respectively positioned on and under the solar cells 1. The upper and lower protective layers 20a and 20b may be formed of ethylene vinyl acetate (EVA), etc. Other materials may be used.

As shown in FIG. 1, the plurality of solar cells 1 are arranged in a matrix structure. Although FIG. 1 shows the solar cells 1 having the structure of 3×2 matrix, the number of solar cells 1 in column and/or row directions may vary, if necessary or desired.

All of the solar cells 1 have the same structure. In the example embodiment of the invention, each solar cell 1 is a back contact solar cell in which an electron current collector serving as a terminal for outputting electrons to the outside and a hole current collector serving as a terminal for outputting holes to the outside are formed on a back surface of the solar cell 1.

An example configuration of the back contact solar cell is described below with reference to FIGS. 4 and 5.

Figure 4:
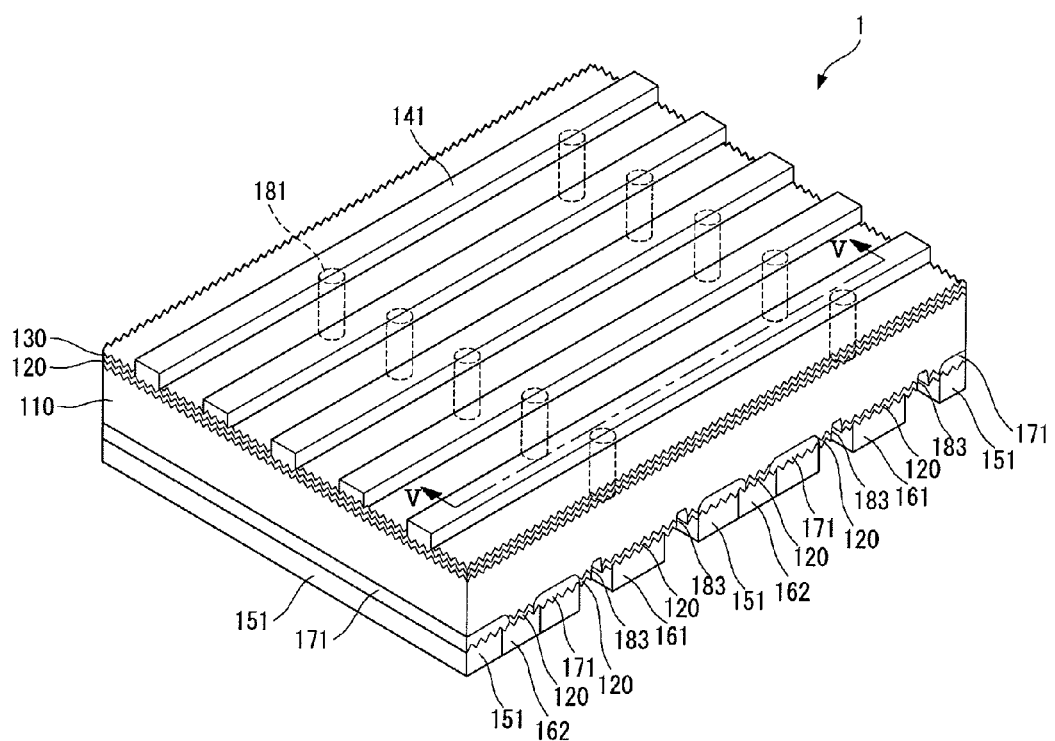
FIG. 4 is a partial perspective view of a solar cell according to an example embodiment of the invention.
Figure 5:
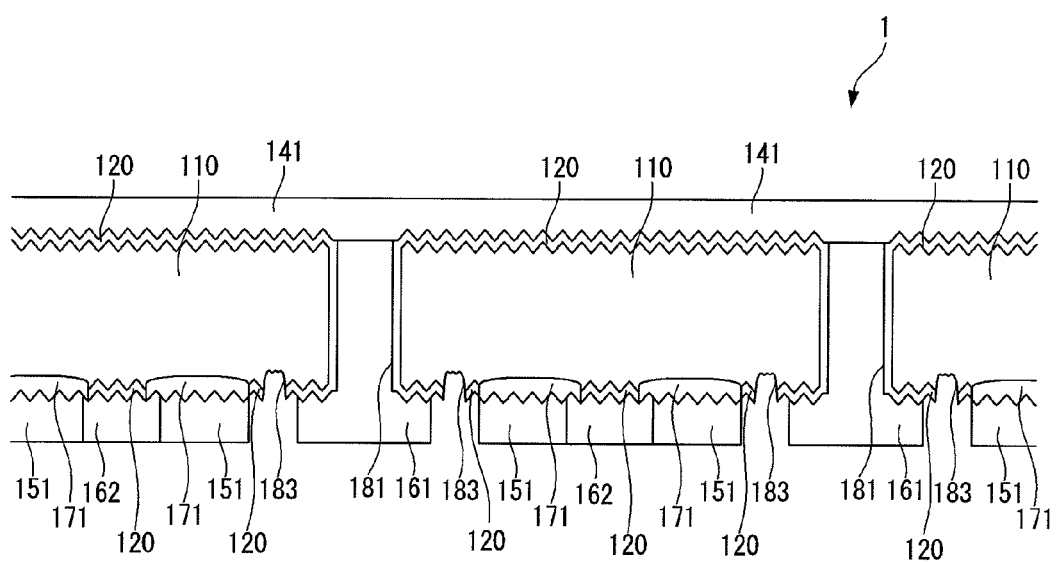
FIG. 5 is a cross-sectional view taken along line V-V of FIG. 4.

As shown in FIGS. 4 and 5, the solar cell 1 according to the embodiment of the invention includes a substrate 110 having a plurality of via holes 181, an emitter layer 120 positioned in the substrate 110, an anti-reflection layer 130 positioned on the emitter layer 120 of an incident surface (hereinafter, referred to as "a front surface") of the substrate 110 on which light is incident, a plurality of front electrodes 141 positioned on the emitter layer 120 of the front surface of the substrate 110 on which the anti-reflection layer 130 is not positioned, a plurality of back electrodes 151 positioned on a surface (hereinafter, referred to as "a back surface"), opposite the front surface of the substrate 110, on which the light is not incident, a plurality of front electrode current collectors 161, a plurality of back electrode current collectors 162, and a back surface field (BSF) layer 171 positioned on the back surface of the substrate 110. The plurality of front electrode current collectors 161 (or portions thereof) are positioned in each of the via holes 181 and on the emitter layer 120 of the back surface of the substrate 110 around the via holes 181 and are electrically connected to the plurality of front electrodes 141. The back electrode current collectors 162 are positioned on the back surface of the substrate 110 and are electrically connected to the back electrodes 151.

The substrate 110 is a semiconductor substrate, which may be formed of first conductive type silicon, for example, p-type silicon, though not required. Examples of silicon include single crystal silicon, polycrystalline silicon, and amorphous silicon. When the substrate 110 is of a p-type, the substrate 110 contains impurities of a group III element such as boron (B), gallium (Ga), and indium (In). Alternatively, the substrate 110 may be of an n-type, and/or be formed of semiconductor materials other than silicon. If the substrate 110 is of the n-type, the substrate 110 may contain impurities of a group V element such as phosphor (P), arsenic (As), and antimony (Sb).

The surface of the substrate 110 is textured to form a textured surface corresponding to an uneven surface or having uneven characteristics. FIG. 4 shows that only an edge of the substrate 110 and only an edge of the anti-reflection layer 130 on the substrate 110 have a plurality of uneven portions for the sake of brevity. However, the entire front surface of the substrate 110 is the textured surface having the plurality of uneven portions, and thus the anti-reflection layer 130 on the front surface of the substrate 110 has the textured surface having the plurality of uneven portions.

Light incident on the front surface of the substrate 110 are reflected several times because of the anti-reflection layer 130 and the textured surface of the substrate 110 having the plurality of uneven portions and is incident to the inside of the substrate 110. Hence, an amount of light reflected from the front surface of the substrate 110 decreases, and an amount of light incident to the inside of the substrate 110 increases. Further, the size of the front surface of the substrate 110 and the surface area of the anti-reflection layer 130 increase because of the textured surface of the substrate 110. As a result, an amount of light incident on the substrate 110 increases.

The emitter layer 120 is a region obtained by doping the substrate 110 with impurities of a second conductive type (for example, an n-type) opposite the first conductive type of the substrate 110, so as to be an n-type semiconductor, for example. Thus, the emitter layer 120 of the second conductive type forms a p-n junction along with the substrate 110 of the first conductive type.

A plurality of electron-hole pairs produced by light incident on the substrate 110 are separated into electrons and holes by a built-in potential difference resulting from the p-n junction between the substrate 110 and the emitter layer 120. Then, the separated electrons move to the n-type semiconductor, and the separated holes move to the p-type semiconductor. Thus, when the substrate 110 is of the p-type and the emitter layer 120 is of the n-type, the separated holes and the separated electrons move to the substrate 110 and the emitter layer 120, respectively.

Because the emitter layer 120 forms the p-n junction along with the substrate 110, the emitter layer 120 may be of the p-type when the substrate 110 is of the n-type unlike the embodiment described above. In this instance, the separated electrons and the separated holes move to the substrate 110 and the emitter layer 120, respectively.

Returning to the embodiment of the invention, when the emitter layer 120 is of the n-type, the emitter layer 120 may be formed by doping the substrate 110 with impurities of a group V element such as P, As, and Sb. On the contrary, when the emitter layer 120 is of the p-type, the emitter layer 120 may be formed by doping the substrate 110 with impurities of a group III element such as B, Ga, and In.

The anti-reflection layer 130 positioned on the emitter layer 120 of the front surface of the substrate 110 is formed of silicon nitride (SiNx) and/or silicon oxide ($SiO_x$). The anti-reflection layer 130 reduces a reflectance of light incident on the solar cell 1 and increases selectivity of a predetermined wavelength band, thereby increasing the efficiency of the solar cell 1. The anti-reflection layer 130 may have a single-layered structure or a multi-layered structure such as a double-layered structure. The anti-reflection layer 130 may be omitted, if desired.

An exposing portion exposing a portion of an edge of the front surface of the substrate 110 is formed in the anti-reflection layer 130 and the emitter layer 120 underlying the anti-reflection layer 130. Thus, the exposing portion electrically separates the emitter layer 120 formed in the front surface of the substrate 110 from the emitter layer 120 formed in the back surface of the substrate 110.

The plurality of front electrodes 141 are positioned on the emitter layer 120 formed in the front surface of the substrate 110 and are electrically and physically connected to the emitter layer 120. The front electrodes 141 extend substantially parallel to one another in a fixed direction.

The front electrodes 141 collect carriers (e.g., electrons) moving to the emitter layer 120 and transfer the carriers to the front electrode current collectors 161, serving as the electron current collector, electrically connected to the front electrodes 141 through the via holes 181. The front electrodes 141 contain at least one conductive material. Examples of the conductive material include at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used.

Each of the plurality of front electrode current collectors 161 positioned on the back surface of the substrate 110 is referred to as a bus bar and is formed of at least one conductive material. The front electrode current collectors 161 extend substantially parallel to one another in a direction crossing an extending direction of the front electrodes 141 positioned on the front surface of the substrate 110 and thus have a stripe shape.

As shown in FIGS. 4 and 5, the plurality of via holes 181 are formed in the substrate 110 at crossings of the front electrodes 141 and the front electrode current collectors 161. Because at least one of the front electrode 141 and the front electrode current collector 161 extends to at least one of the front surface and the back surface of the substrate 110 through the via hole 181, the front electrode 141 and the front electrode current collector 161 respectively positioned on the opposite surfaces of the substrate 110 are connected to each other. Hence, the front electrodes 141 are electrically and physically connected to the front electrode current collectors 161 through the via holes 181.

The front electrode current collectors 161 output the carriers transferred from the front electrodes 141 electrically connected to the front electrode current collectors 161 to an external device.

In the embodiment of the invention, the front electrode current collectors 161 contain silver (Ag), but may contain at least one selected from the group consisting of Ni, Cu, Al, Sn, Zn, In, Ti, Au, and a combination thereof instead of Ag. Other conductive materials may be used.

The back electrodes 151 on the back surface of the substrate 110 are positioned to be spaced apart from the front electrode current collectors 161 adjacent to the back electrodes 151. The back electrodes 151 are positioned on almost the entire back surface of the substrate 110 excluding a formation portion of the front electrode current collectors 161 at the back surface of the substrate 110. The back electrodes 151 may not be positioned at an edge of the back surface of the substrate 110. The back electrodes 151 collect carriers (e.g., holes) moving to the substrate 110.

The emitter layer 120 positioned at the back surface of the substrate 110 has a plurality of expositing portions 183 that expose a portion of the back surface of the substrate 110 and surround the front electrode current collectors 161. The expositing portions 183 block an electrical connection between the front electrode current collectors 161 collecting electrons or holes and the back electrodes 151 collecting holes or electrons, thereby causing the electrons and the holes to move smoothly.

The back electrodes 151 contain at least one conductive material, for example, aluminum (Al). For example, the back electrodes 151 may contain at least one selected from the group consisting of Ni, Cu, Ag, Sn, Zn, In, Ti, Au, and a combination thereof or other conductive materials.

In the embodiment of the invention, the back electrode current collectors 162 serving as the hole current collector are positioned on the back surface of the substrate 110, are electrically and physically connected to the back electrodes 151, and extend parallel to the front electrode current collectors 161. Thus, the back electrode current collectors 162 collect carriers (for example, holes) transferred from the back electrodes 151 and output the carriers to the external device.

The back electrode current collectors 162 are formed of the same material as the front electrode current collectors 161. Thus, the back electrode current collectors 162 contain at least one conductive material, for example, silver (Ag). For example, the back electrode current collectors 162 may contain at least one selected from the group consisting of Ni, Cu, Al, Sn, Zn, In, Ti, Au, and a combination thereof or other conductive materials.

Although the embodiment of the invention illustrates the two front electrode current collectors 161 and the three back electrode current collectors 162, the number of front electrode current collectors 161 and the number of back electrode current collectors 162 may vary if desired. Further, in the embodiment of the invention, the back electrode current collectors 162 have a stripe shape long extending in a fixed direction in the same manner as the front electrode current collectors 161.

Figure 6:
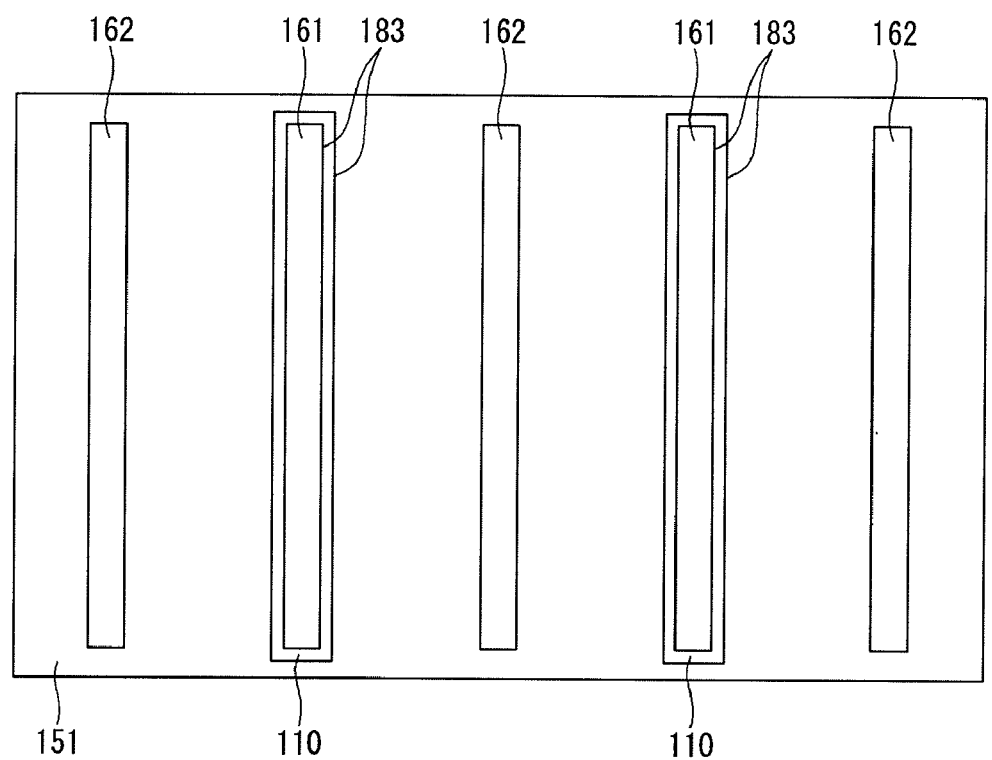
FIGS. 6 and 7 are plane views schematically showing a back surface of the solar cell shown in FIG. 4.

FIG. 6 illustrates the back surface of the substrate 110 on which the front electrode current collectors 161 and the back electrode current collectors 162 are positioned. As shown in FIG. 6, the front electrode current collectors 161 and the back electrode current collectors 162 are alternately positioned on the back surface of the substrate 110 at a constant distance therebetween. The back electrodes 151 (or portions thereof) are positioned between the front electrode current collectors 161 and the back electrode current collectors 162. In this instance, the exposing portions 183 are formed along the front electrode current collectors 161, so as to provide an electrical insulation between the back electrodes 151 and the front electrode current collectors 161. Hence, a portion of the substrate 110 is exposed through the exposing portions 183.

Unlike the embodiment of the invention discussed above, each back electrode 151 and each back electrode current collector 162 may partially overlap each other in other embodiments of the invention. For example, a portion of an edge of the back electrode current collector 162 may be positioned on the back electrode 151, or a portion of the back electrode 151 may be positioned on the back electrode current collector 162. In this instance, a contact area between the back electrode 151 and the back electrode current collector 162 increases, and a contact resistance between the back electrode 151 and the back electrode current collector 162 decreases. As a result, a transfer of carriers from the back electrode 151 to the back electrode current collector 162 may be stably performed because of the stable contact therebetween.

Figure 7:
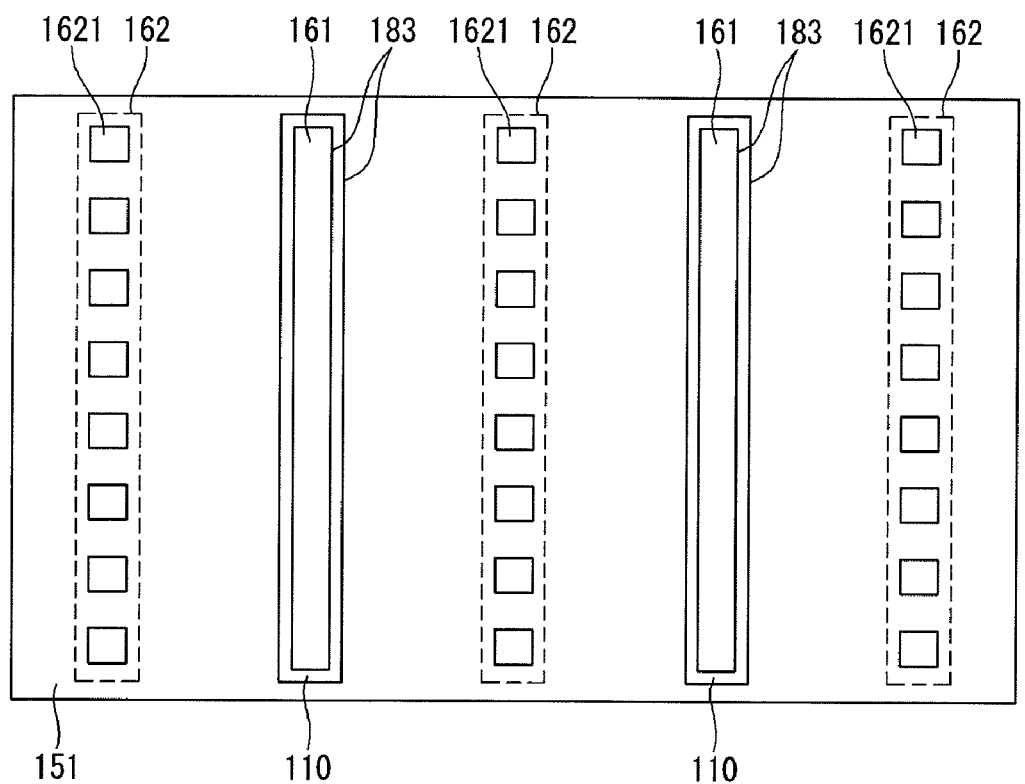

Alternatively, as shown in FIG. 7, each back electrode current collector 162 has an island shape in which a plurality of conductors 1621 are positioned in a fixed direction at a constant distance therebetween. Each of the plurality of conductors 1621 may have various cross-sectional shapes such as a rectangle, a triangle, a circle, and an oval. Even in this instance, each conductor 1621 may partially overlap the back electrode 151.

The back surface field layer 171 is a region (for example, a $p^+$-type region) obtained by more heavily doping a portion of the back surface of the substrate 110 with impurities of the same conductive type as the substrate 110 than the substrate 110. Because the back surface field layer 171 is positioned at the back surface of the substrate 110 adjoining the back electrodes 151, the back electrodes 151 are electrically connected to the substrate 110 through the back surface field layer 171.

The movement of electrons to the back surface field layer 171 is prevented or reduced and also the movement of holes to the back surface field layer 171 is facilitated because of a potential barrier formed by a difference between impurity concentrations of the substrate 110 and the back surface field layer 171. Thus, a recombination and/or a disappearance of electrons and holes in and around the back surface of the substrate 110 are prevented or reduced, and the movement of desired carriers (for example, holes) is accelerated. As a result, a transfer amount of carriers between the back electrodes 151 and the back electrode current collectors 162 increases.

The solar cell 1 according to the embodiment of the invention having the above-described structure is a solar cell in which the front electrode current collectors 161 electrically connected to the front electrodes 141 are positioned on the back surface of the substrate 110 on which light is not incident. An operation of the solar cell 1 is described below.

When light irradiated to the solar cell 1 is incident on the substrate 110 through the emitter layer 120, a plurality of electron-hole pairs are generated in the substrate 110 by light energy based on the incident light. Because the surface of the substrate 110 is the textured surface, a light reflectance in the entire surface of the substrate 110 decreases and an amount of light incident on the substrate 110 increases. In addition, because a reflection loss of the light incident on the substrate 110 is reduced by the anti-reflection layer 130, an amount of light incident on the substrate 110 further increases.

The electron-hole pairs are separated into electrons and holes by the p-n junction between the substrate 110 and the emitter layer 120, and the separated electrons move to the n-type emitter layer 120 and the separated holes move to the p-type substrate 110. The electrons moving to the n-type emitter layer 120 are collected by the front electrodes 141 and then move to the front electrode current collectors 161 electrically connected to the front electrodes 141 through the via holes 181. The holes moving to the p-type substrate 110 are collected by the back electrodes 151 through the back surface field layer 171 and then move to the back electrode current collectors 162. When the front electrode current collectors 161 are connected to the back electrode current collectors 162 using electric wires, current flows therein to thereby enable use of the current for electric power.

Returning again to FIGS. 1 to 3, the lower protective layer 20b underlying the plurality of solar cells 1 has a plurality of openings 21, unlike the upper protective layer 20a. Thus, the upper protective layer 20a and the lower protective layer 20b have different structures.

A location of the openings 21 corresponds to the current collectors 161 and 162 of each solar cell 1, and at least a portion of the corresponding current collector is exposed through each opening 21. In this instance, a width of the opening 21 is equal to or less than widths of the current collectors 161 and 162. However, the width of the opening 21 may be greater than the widths of the current collectors 161 and 162.

The insulating sheet 30 between the lower protective layer 20b and the pattern forming part 50 is formed of an insulating material and insulates between the lower protective layer 20b and the pattern forming part 50. The insulating sheet 30 has a plurality of openings 31. A location of the openings 31 corresponds to the openings 21 of the lower protective layer 20b, and at least a portion of the corresponding current collector is exposed through each opening 31.

Figure 2:
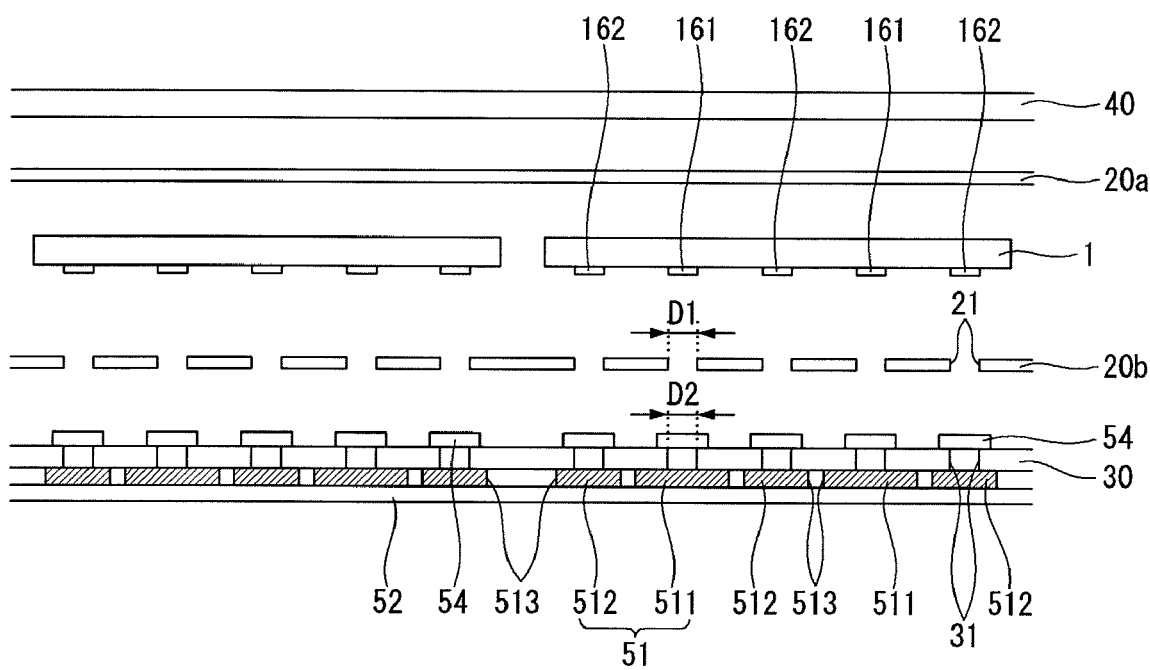
FIG. 2 is a partial cross-sectional view of the solar cell module shown in FIG. 1 before a lamination process is performed.

As shown in FIG. 2, a width D2 of the opening 31 of the insulating sheet 30 is substantially equal to a width D1 of the opening 21 of the lower protective layer 20b. However, the width D2 and the width D1 may be different from each other. For example, the width D2 of the opening 31 of the insulating sheet 30 may be less or greater than the width D1 of the opening 21 of the lower protective layer 20b.

As shown in FIG. 1, the openings 21 and 31 have lengths and widths corresponding to lengths and widths of the current collectors 161 and 162 opposite the openings 21 and 31 and have a stripe shape long extending in a fixed direction.

Figure 8:
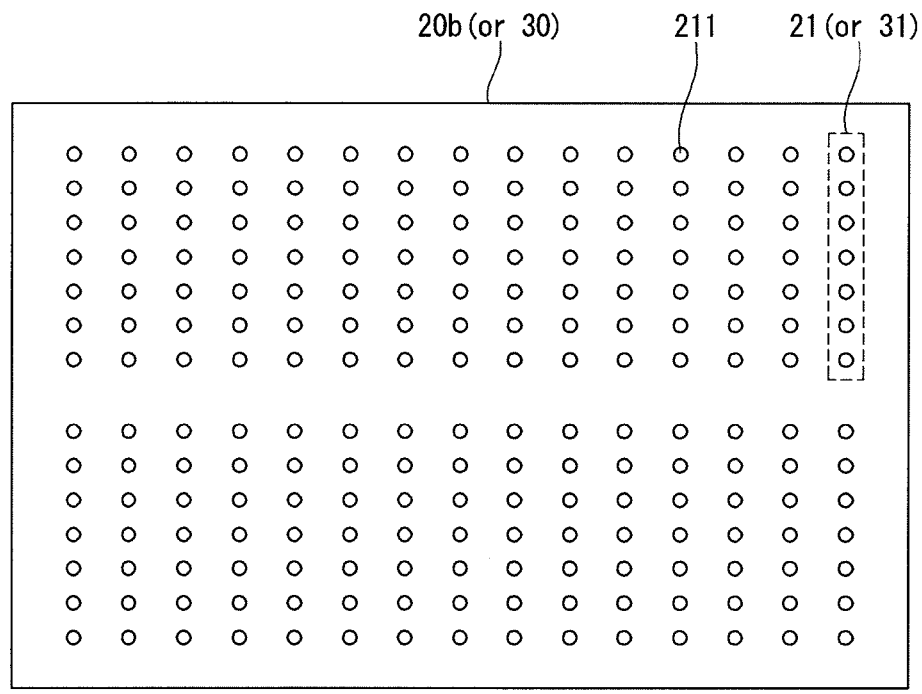
FIG. 8 illustrates another configuration of at least one of a lower protective layer and an insulating sheet.

However, unlike the shape shown in FIG. 1, as shown in FIG. 8, at least one of the openings 21 and 31 may have the structure in which a plurality of holes 211 are arranged along the extending direction of the current collectors 161 and 162. Each hole 211 may have various cross-sectional shapes such as a circle, a polygon and an oval, and a distance between the holes 211 may be uniform or non-uniform. Further, the size and the number of holes 211 may be determined based on the length and the width of the current collectors 161 and 162. In this instance, the current collectors 161 and 162 are exposed through the holes 211.

The pattern forming part 50 electrically connects the plurality of solar cells 1 to one another and prevents the moisture from penetrating into a back surface of the solar cell module 100, thereby protecting the plurality of solar cells 1 from an external environment. As shown in FIGS. 1 and 2, the pattern forming part 50 includes a back sheet 52 and a conductive pattern part 51 on the back sheet 52.

The back sheet 52 is formed using a thin sheet formed of an insulating material such as fluoropolymer/polyester/fluoropolymer (FP/PE/FP). Other insulating materials may be used. The back sheet 52 prevents moisture and oxygen from penetrating into the back surface of the solar cell module 100, thereby protecting the solar cells 1 from the external environment. The back sheet 52 may have a multi-layered structure including a moisture/oxygen penetrating prevention layer, a chemical corrosion prevention layer, an insulation layer, etc.

The conductive pattern part 51 is positioned on the back sheet 51. In the embodiment of the invention, the conductive pattern part 51 is formed of copper (Cu). However, the conductive pattern part 51 may be formed of different conductive materials, for example, silver (Ag), aluminum (Al), or nickel (Ni).

Another conductive layer may be formed on the conductive pattern part 51 by coating a conductive material on the conductive pattern part 51, so as to improve the conductivity of the conductive pattern part 51 and contact characteristic between the conductive pattern part 51 and the solar cells 1. The conductive pattern part 51 and the conductive layer may be formed of the same conductive material or different conductive materials each having different characteristic. When the conductive pattern part 51 and the conductive layer are formed of the different conductive materials, the conductivity of the conductive layer may be more excellent (or improved) than the conductivity of the conductive pattern part 51 alone. In this instance, the conductive pattern part 51 may be formed of Al or Ni, etc., and the conductive layer on the conductive pattern part 51 may be formed of Au or Ag, etc.

Figure 3:
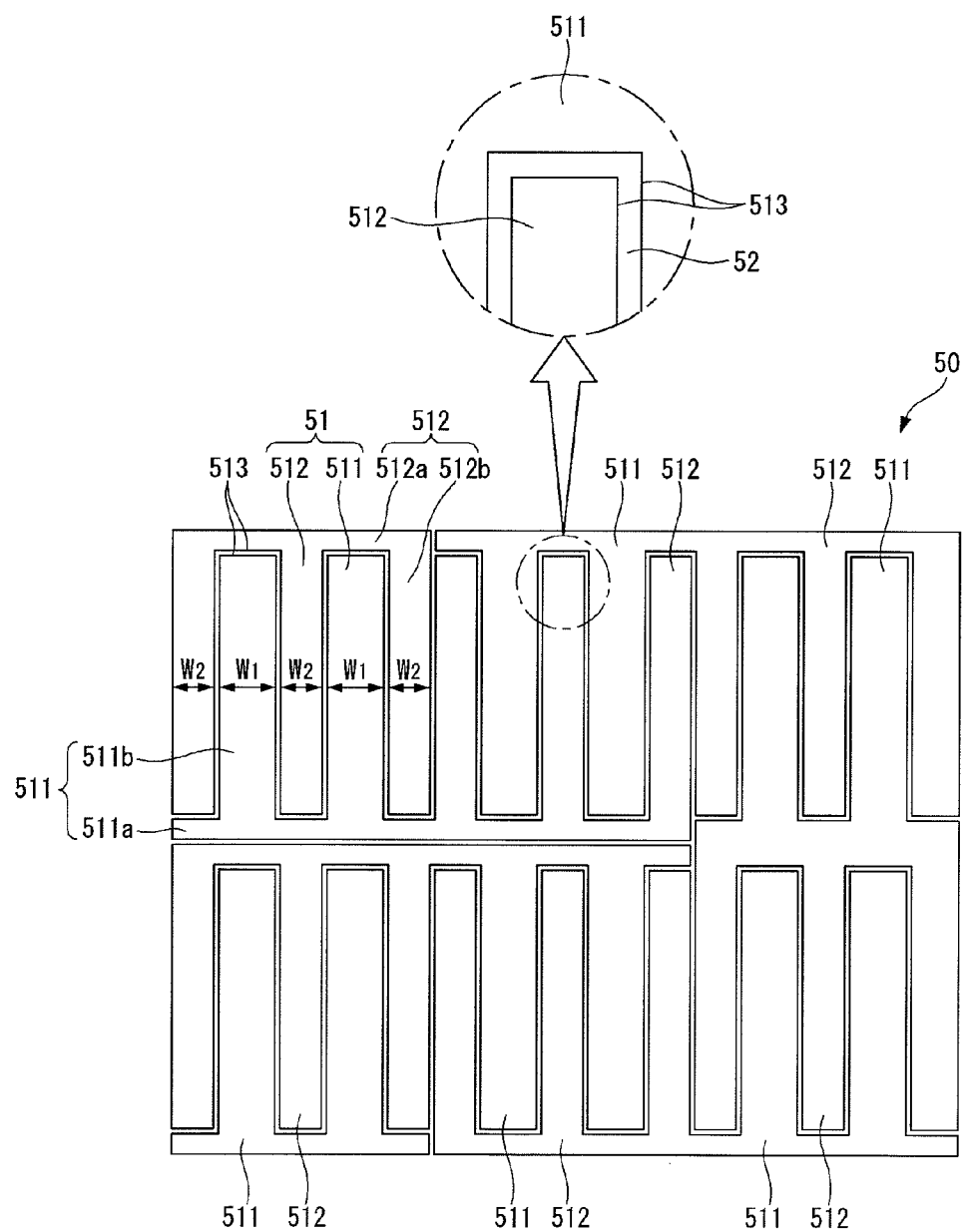
FIG. 3 is a plane view schematically showing an example configuration of a conductive pattern part of the solar cell module shown in FIG. 1.

In the embodiment shown in FIG. 3, the pattern forming part 50 and the conductive pattern part 51 are able to accommodate six solar cells 1, although such is not required, whereby three solar cells 1 may be disposed in the upper row, and three solar cells 1 may be disposed in the lower row. Starting at the upper left corner of the pattern forming part 50 and counting in a clockwise direction, it can be seen that first through sixth solar cells 1 may be accommodated by the pattern forming part 50.

The conductive pattern part 51 has a plurality of front electrode patterns 511 contacting the plurality of front electrode current collectors 161 of each solar cell 1, a plurality of back electrode patterns 512 contacting the plurality of back electrode current collectors 162 of each solar cell 1, and a separation part 513 for separating the front electrode patterns 511 and the back electrode patterns 512. Thus, the insulating material of the back sheet 52 is exposed in a formation portion of the separation part 513. When the lamination process is performed, the separation part 513 is filled with the insulating material of the back sheet 52. A width of the separation part 513 may be adjusted based on the number and the size of each of the front electrode patterns 511 and the back electrode patterns 512, the size of the back sheet 52 on which the conductive pattern part 51 is positioned, a distance between the adjacent solar cells 1 arranged in the matrix structure, etc.

The front electrode patterns 511 and the back electrode patterns 512 respectively include main branches 511a and 512a extending in a transverse direction and sub-branches (i.e., protrusions) 511b and 512b that extend from the main branches 511a and 512a in a longitudinal direction and have a comb teeth shape. The protrusions 511b and 512b are separated from each other by the size (i.e., a width) of the separation part 513 and are dovetailed into each other. Thus, a pair of electrode patterns 511 and 512 corresponding to one solar cell 1 are electrically insulated from each other by the separation part 513.

Further, in the electrode patterns 511 and 512 corresponding to the two solar cells 1 that are positioned adjacent to each other in a row direction on the same row (for example, second and third solar cells according to the convention defined above), the front electrode pattern 511 corresponding to one current collector (for example, the front electrode current collector 161) of one solar cell 1 (the second solar cell) of the two solar cells 1 is connected to the back electrode pattern 512 corresponding to one current collector (for example, the back electrode current collector 162) of the other solar cell 1 (the third solar cell) of the two solar cells 1. In this instance, the back electrode pattern 512 of the one solar cell 1 (the second solar cell) and the front electrode pattern 511 of the other solar cell 1 (the third solar cell), which are not connected to each other, are connected to the electrode patterns 511 and 512 corresponding to other solar cells 1 (respectively the first solar cell and the fourth solar cell) adjacent to the two solar cells 1 (the second and third solar cells) in the row direction.

In addition, in the electrode patterns 511 and 512 corresponding to the two solar cells 1 that are positioned on different lines and are adjacent to each other in a first column (the first and sixth solar cells) or a last column in a column direction (the third and fourth solar cells), the front electrode pattern 511 corresponding to one current collector (for example, the front electrode current collector 161) of one solar cell 1 (third solar cell) of the two solar cells 1 is connected to the back electrode pattern 512 corresponding to one current collector (for example, the back electrode current collector 162) of the other solar cell 1 (the fourth solar cell) of the two solar cells 1. In this instance, the back electrode pattern 512 of the one solar cell 1 (the third solar cell) and the front electrode pattern 511 of the other solar cell 1 (the fourth solar cell), that are not connected to each other, are connected to the electrode patterns 511 and 512 corresponding to other solar cells 1 (respectively the second solar cell and the fifth solar cell) adjacent to the two solar cells 1 (the third and fourth solar cells) in the line direction.

In the conductive pattern part 51, the different kinds of electrode patterns 511 and 512 not connected to the different kinds of electrode patterns 512 and 511 are connected to an external device (for example, a junction box) positioned on a back surface (i.e., a lower portion) of the pattern forming part 50 through a separate wire or a conductive tape.

Hence, the front electrode current collectors 161 of each solar cell 1 exposed through the openings 31 of the insulating sheet 30 and the openings 21 of the lower protective layer 20b are positioned opposite the front electrode patterns 511 of the conductive pattern part 51. Further, the back electrode current collectors 162 of each solar cell 1 exposed through the openings 21 and 31 are positioned opposite the back electrode patterns 512 of the conductive pattern part 51.

As shown in FIG. 3, widths w1 of the protrusions 511b of the front electrode patterns 511 are substantially equal to one another, and widths w2 of the protrusions 512b of the back electrode patterns 512 are substantially equal to one another. Further, the width w1 of the protrusion 511b of the front electrode pattern 511 is greater than the width w2 of the protrusion 512b of the back electrode pattern 512, but is not limited thereto.

More specifically, the width w1 of the protrusion 511b of the front electrode pattern 511 may be equal to or greater than the width w2 of the protrusion 512b of the back electrode pattern 512. The widths w1 and w2 of the protrusions 511b and 512b may be determined based on the number of front electrode current collectors 161 and the number of back electrode current collectors 162. For example, as the number of current collectors 161 and 162 increases, an amount of current flowing through the protrusions 511b and 512b decreases. Thus, as an amount of current flowing through the protrusions 511b and 512b (i.e., an amount of load) decreases, the widths w1 and w2 of the protrusions 511b and 512b decrease. In the embodiment of the invention, because the two front electrode current collectors 161 and the three back electrode current collectors 162 are positioned (or exists) on the back surface of the substrate 110, the width w1 of the front electrode pattern 511 is greater than the width w2 of the back electrode pattern 512. Further, a ratio of an area of the back electrode pattern 512 to an area of the front electrode pattern 511 is approximately 0.6 to 1:1 to 0.6. That is, the ratio of the area of the back electrode pattern 512 to the area of the front electrode pattern 511 is X:Y, when the area of area of the back electrode pattern 512 is represented by X and the area of the front electrode pattern 511 is represented by Y, where X may vary from approximately 0.6 to 1 and Y may vary from approximately 1 to 0.6. When the above area ratio between the electrode patterns 511 and 512 is satisfied, carriers transferred to the electrode patterns 511 and 512 may be more smoothly transferred, and the size of each of the electrode patterns 511 and 512 may be properly determined suitable for the size (for example, a width of a long axis) of the conductive pattern part 51.

A thickness of each of the electrode patterns 511 and 512 may be approximately 25 μm to 50 μm. When the thickness of each of the electrode patterns 511 and 512 is equal to or greater than approximately 25 μm, the conductivity having a desired intensity is obtained. When the thickness of each of the electrode patterns 511 and 512 is equal to or less than approximately 50 μm, the electrode patterns 511 and 512 may smoothly contact the corresponding portions of the solar cell 1 while reducing a difficulty in forming the electrode patterns 511 and 512 through an etching process, etc. Further, when the separation part 513 is filled with the formation material (i.e., the insulating material) of the back sheet 52 during the lamination process, the separation part 513 may be stably filled with the insulating material because the separation part 513 is not very deep (i.e., a thickness of the separation part 513 is not very large). Hence, the electrical insulation between the front electrode pattern 511 and the back electrode pattern 512 may be stably provided.

Resistances of the protrusions 511b and 512b contacting the current collectors 161 and 162 exposed through the openings 21 and 31 are mainly affected by a cross-sectional area (=width×height) and a length of each of the protrusions 511b and 512b of the electrode patterns 511 and 512. As the cross-sectional areas of the protrusions 511b and 512b increase, the resistances of the protrusions 511b and 512b decrease. Further, as the lengths of the protrusions 511b and 512b increase, the resistances of the protrusions 511b and 512b increases.

Accordingly, the resistance of each of the protrusions 511b and 512b has to be maintained to be equal to less than a setting value (or a predetermined value), so as to smoothly perform a transfer of carries using the protrusions 511b and 512b. In other words, when the resistance of each of the protrusions 511b and 512b is greater than the setting value, the transfer of carries is not smoothly performed because of the resistances of the protrusions 511b and 512b. In the embodiment of the invention, the setting value, i.e., a maximum resistance is approximately 0.01179Ω. Each of the protrusions 511b and 512b has to have the cross-sectional area equal to or greater than $22.5 \times 10^{-8}$ m², so that each of the protrusions 511b and 512b has a resistance equal to or less than the maximum resistance. The maximum resistance is set based on a resistance of a separate conductive tape, such as a ribbon, that is attached on the front electrode current collectors 161 and the back electrode current collectors 162 of each solar cell 1 and electrically connects the solar cells 1 to one another. When the resistance of each of the protrusions 511b and 512b is maintained to be equal to or less than the resistance of the ribbon attached to each solar cell 1, a current normally flows in the solar cells 1.

The lengths of the protrusions 511b and 512b are substantially equal to one another and are determined based on the length of the solar cell 1. Thus, each of the protrusions 511b and 512b may have a desired cross-sectional area by properly adjusting the thicknesses and the widths w1 and w2 of the protrusions 511b and 512b. The length of the solar cell 1 is a length of the solar cell 1 measured along the extending direction of the current collectors 161 and 162.

For this, the widths w1 and w2 of the protrusions 511b and 512b is approximately 2.1 mm to 8.6 mm. When the conductive pattern part 51 is formed of copper (Cu), a specific resistance of each of the protrusions 511b and 512b has a uniform value of approximately $1.72 \times 10^{-8}$ Ω/m.

For example, when the pattern part 51 is formed of copper (Cu) and the length of the solar cell 1 measured along the extending direction of the current collectors 161 and 162 is approximately 156 mm, the thickness of each of the protrusions 511b and 512b may be approximately 35 μm when at least one of the widths w1 and w2 of the protrusions 511b and 512b is approximately 6.4 mm.

As above, each of the protrusions 511b and 512b may have a desired cross-sectional area equal to or greater than a reference value by properly adjusting the thicknesses and the widths w1 and w2 of the protrusions 511b and 512b. Hence, a stable output of carriers is performed.

As shown in FIG. 2, a conductive adhesive part 54 is positioned on the opening 31 of the insulating sheet 30. The conductive adhesive part 54 is filled in the openings 21 and 31 because of heat generated when the lamination process is performed. Hence, the current collectors 161 and 162 exposed through the openings 21 and 31 contact the conductive pattern part 51 by the conductive adhesive part 54 positioned in the openings 21 and 31.

The conductive adhesive part 54 may be formed of a conductive adhesive film, a conductive paste, a conductive epoxy, etc.

The conductive adhesive film may include a resin and conductive particles distributed in the resin. A material of the resin is not particularly limited as long as it has the adhesive property. It is preferable, but not required, that a thermosetting resin is used for the resin so as to increase the adhesive reliability. The thermosetting resin may use at least one selected among epoxy resin, phenoxy resin, acryl resin, polyimide resin, and polycarbonate resin.

The resin may further contain a predetermined material, for example, a known curing agent and a known curing accelerator other than the thermosetting resin. For example, the resin may contain a reforming material such as a silane-based coupling agent, a titanate-based coupling agent, and an aluminate-based coupling agent, so as to improve an adhesive strength between the conductive pattern part 51 and the solar cells 1. The resin may contain a dispersing agent such as calcium phosphate and calcium carbonate, so as to improve the dispersibility of the conductive particles. The resin may contain a rubber component such as acrylic rubber, silicon rubber, and urethane rubber, so as to control the modulus of elasticity of the conductive adhesive film.

A material of the conductive particles is not particularly limited as long as it has the conductivity. The conductive particles may contain at least one metal selected among copper (Cu), silver (Ag), gold (Au), iron (Fe), nickel (Ni), lead (Pb), zinc (Zn), cobalt (Co), titanium (Ti), and magnesium (Mg) as the main component. The conductive particles may be formed of only metal particles or metal-coated resin particles. The conductive adhesive film having the above-described configuration may include a peeling film.

It is preferable, but not required, that the conductive particles use the metal-coated resin particles, so as to mitigate a compressive stress of the conductive particles and improve the connection reliability of the conductive particles. It is preferable, but not required, that the conductive particles have a diameter of 2 µm to 30 µm, so as to improve the dispersibility of the conductive particles.

It is preferable, but not required, that a composition amount of the conductive particles distributed in the resin is 0.5% to 20% based on the total volume of the conductive adhesive film in consideration of the connection reliability after the resin is cured. When the composition amount of the conductive particles is less than 0.5%, a current may not smoothly flow because a physical contact area between the conductive adhesive part 54 and the front electrodes 141 decreases. When the composition amount of the conductive particles is greater than 20%, the adhesive strength may be reduced because a composition amount of the resin relatively decreases.

As a result, the protrusion 511b of each front electrode pattern 511 of the conductive pattern part 51 positioned on the back sheet 52 is electrically connected to the front electrode current collectors 161 of the solar cell 1 corresponding to the conductive pattern part 51. Further, the protrusion 512b of each back electrode pattern 512 of the conductive pattern part 51 is electrically connected to the back electrode current collectors 162 of the solar cell 1 corresponding to the conductive pattern part 51.

As described above, the protrusions 511b of the front electrode patterns 511 corresponding to each solar cell 1 are connected to one another by the main branch 511a, and the protrusions 512b of the back electrode patterns 512 corresponding to each solar cell 1 are connected to one another by the main branch 512a. Therefore, the front electrode current collectors 161 of each solar cell 1 are connected to one another by the front electrode patterns 511, and the back electrode current collectors 162 of each solar cell 1 are connected to one another by the back electrode patterns 512.

Further, as described above, the plurality of solar cells 1 are connected in series to one another by the connection structure between the electrode patterns 511 and 512 of the conductive pattern part 51 and a formation location of the separation part 513. Because the different patterns 511 and 512 of the conductive pattern part 51 are connected to the external device, carriers output by the plurality of solar cells 1 connected in series are output to the external device, thereby allowing a current to flow.

In the embodiment of the invention, instead of the electrical connection of the solar cells 1 using the separate ribbon, the electrical connection of the solar cells 1 is automatically performed by the pattern forming part 50 having the separate conductive pattern part 51.

In other words, the insulating sheet 30 is positioned on the pattern forming part 50, and the conductive adhesive part 54 is positioned at a location corresponding to a formation location of the insulating sheet 30. Then, the lower protective layer 20b is positioned on the insulating sheet 30.

Next, the plurality of solar cells 1 are positioned at a uniform distance therebetween, the upper protective layer 20a is arranged on the solar cells 1, and the transparent member 40 is positioned on the upper protective layer 20a.

Next, the lamination process is performed to form an integral body of the components 1, 20a, 20b, 30, 40, and 50. More specifically, the upper and lower protective layers 20a and 20b are melted because of heat generated when the lamination process is performed. The melted upper and lower protective layers 20a and 20b are filled in a space between the components. The transparent member 40, the upper protective layer 20a, the solar cells 1, the lower protective layer 20b, the insulating sheet 30, and the pattern forming part 50 are attached to one another to form the integral body. Thus, the protective layers 20a and 20b form one protective member through the lamination process. The material (for example, ethylene vinyl acetate (EVA)) forming the one protective member surrounds the solar cells 1 and protects the solar cells 1 from impact or moisture.

Further, the conductive adhesive part 54 is filled in the openings 21 and 31 because of the heat generated when the lamination process is performed. The front electrode current collectors 161 and the back electrode current collectors 162 of each solar cell 1 are connected to the conductive pattern part 51 of the pattern forming part 50 by the conductive adhesive part 54.

Thus, instead of a process in which the ribbon is cut and then is attached on the current collectors 161 and 162 of the solar cells 1, the electrical connection of the solar cells 1 is automatically completed through the lamination process performed using the conductive pattern part 51 having a desired pattern. As a result, manufacturing time of the solar cell module 100 is reduced, and thus the production efficiency of the solar cell module 100 is improved.

FIGS. 1 and 2 illustrates that the conductive pattern part 51 and the back sheet 52 are manufactured to form an integral body, i.e., the pattern forming part 50. In this instance, the conductive pattern part 51 is formed by forming a conductive layer formed of copper (Cu), etc. on the back sheet 52, patterning the conductive layer in a desired shape using a dry etching method or a wet etching method, etc., and forming the conductive layer having the desired shape on the back sheet 52.

However, the conductive pattern part 51 and the back sheet 52 may be manufactured as a separate part. In this instance, the conductive pattern part 51, which is patterned in a desired shape to have a sheet form, is positioned on the back sheet 52 as a separate part. A formation location of the conductive pattern part 51 is determined in consideration of formation locations of the openings 21 of the lower protective layer 20*b* and the openings 31 of the insulating sheet 30. Hence, when the conductive pattern part 51 and the back sheet 52 are manufactured as a separate part, only the back sheet 52 serves as a back sheet.

Further, the insulating sheet 30 and the pattern forming part 50 may be manufactured to form an integral body. In this instance, the pattern forming part 50 may include the insulating sheet 30, the conductive pattern part 51, and the back sheet 52.

FIG. 2 shows the conductive adhesive part 54 positioned on the insulating sheet 30. However, the conductive adhesive part 54 may be positioned on the lower protective layer 20*b* or on the insulating sheet 30 and the conductive pattern part 51. When the conductive adhesive part 54 is positioned on the lower protective layer 20*b*, the conductive adhesive part 54 may be positioned on the openings 21 of the lower protective layer 20*b*. When the conductive adhesive part 54 is positioned on the conductive pattern part 51, the conductive adhesive part 54 may be positioned at a location corresponding to the openings 31 of the insulating sheet 30.

The frame 60 receives the components 50, 31, 20*b*, 1, 20*a*, and 40 forming an integral body. The frame 60 is formed of a material, for example, aluminum coated with an insulating material that does not generate corrosion, deformation, etc., under influence of the external environment. The frame 60 has the structure in which the drainage process, the installation, and the execution are easily performed.

Figure 9:
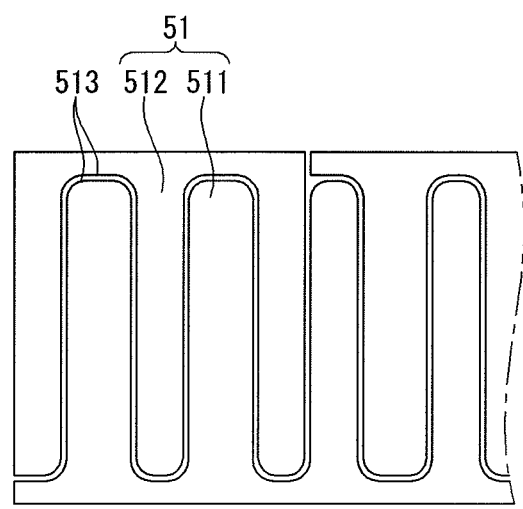
FIG. 9 is a plane view schematically showing another example configuration of the conductive pattern part of the solar cell module shown in FIG. 1.

As shown in FIG. 3, each of the protrusions 511*b* and 512*b* has an angular edge. However, as shown in FIG. 9, the edge of each of the protrusions 511*b* and 512*b* may have a curved shape. When the edge of each of the protrusions 511*b* and 512*b* has the angular shape, carriers may concentrate in an angular portion (i.e., the angular edge) of each of the protrusions 511*b* and 512*b*. Hence, the carriers are not uniformly distributed in each of the protrusions 511*b* and 512*b*, and the problem such as an arc is caused. However, when the edge of each of the protrusions 511*b* and 512*b* has the curved shape as shown in FIG. 9, the carriers are uniformly distributed in each of the protrusions 511*b* and 512*b*. Hence, the electrical problem such as the arc is prevented or reduced.

A solar cell module according to another example embodiment of the invention is described in detail below with reference to FIGS. 10 and 11.

Figure 10:
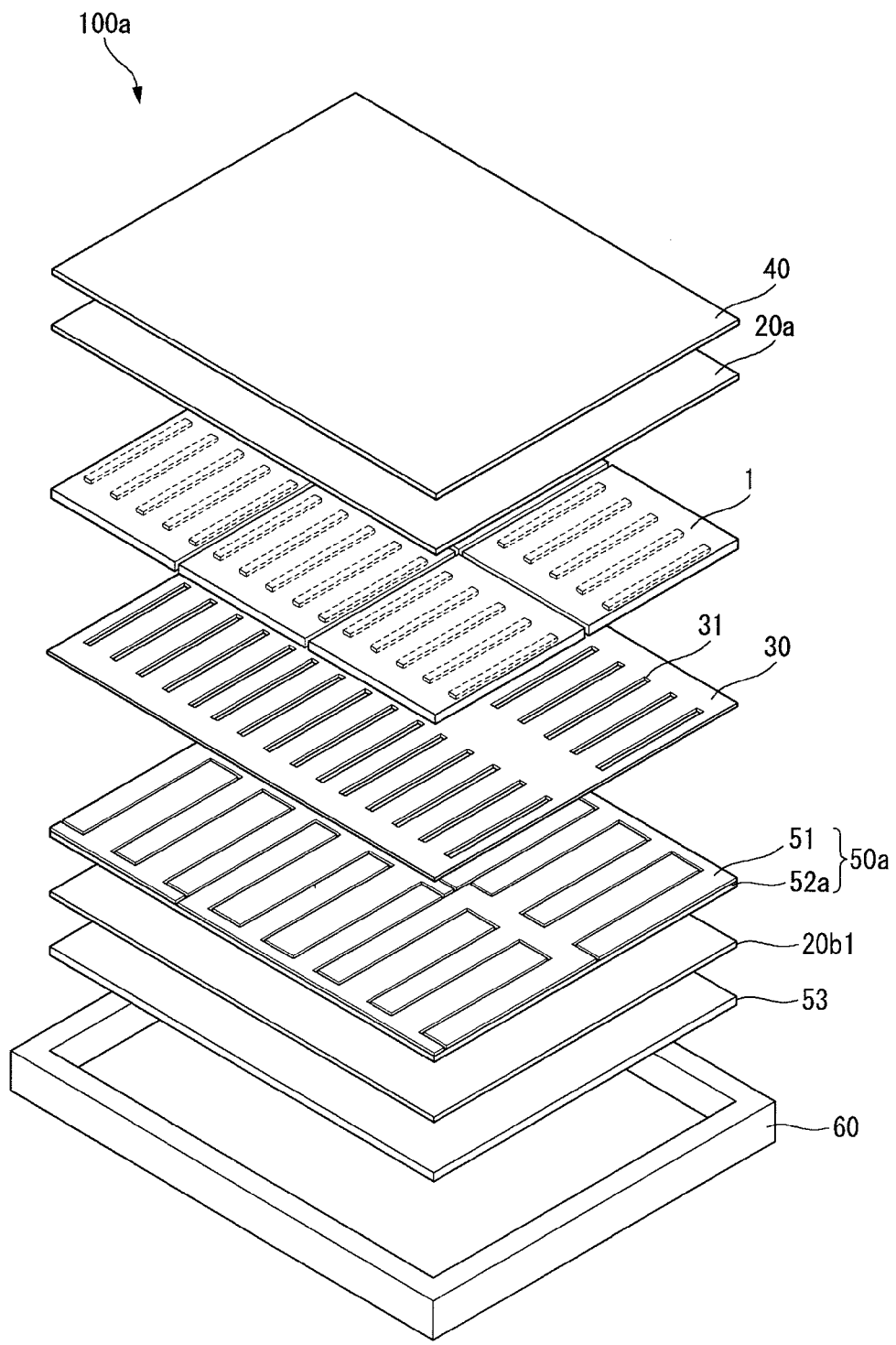
FIG. 10 is a perspective view schematically showing a solar cell module according to another example embodiment of the invention.

FIG. 10 is a perspective view schematically showing a solar cell module according to another example embodiment of the invention. FIG. 11 is a partial cross-sectional view of the solar cell module shown in FIG. 10 before a lamination process is performed.

Structures and components identical or equivalent to those illustrated in FIGS. 1 and 2 are designated with the same reference numerals, and a further description may be briefly made or may be entirely omitted.

Unlike the solar cell module 100 shown in FIGS. 1 and 2 in which the pattern forming part 50 is positioned under the lower protective layer 20*b*, a pattern forming part 50 of a solar cell module 100*a* sown in FIG. 10 is positioned on a lower protective layer 20*b*1. Thus, a formation order and a shape of the lower protective layer 20*b*1 of the solar cell module 100*a* are different from the solar cell module 100.

The solar cell module 100*a* is described in detail below.

Figure 11:
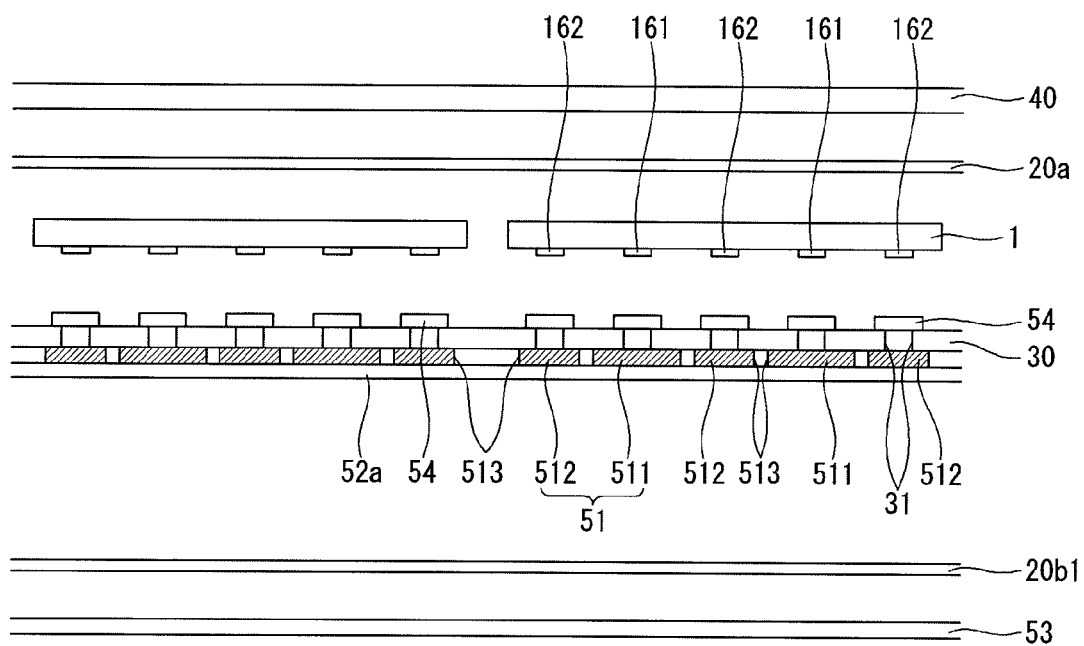
FIG. 11 is a partial cross-sectional view of the solar cell module shown in FIG. 10 before a lamination process is performed.

As shown in FIGS. 10 and 11, the solar cell module 100*a* includes a plurality of solar cells 1 arranged in a matrix structure, a upper protective layer 20*a* positioned on the solar cells 1, an insulating sheet 30 positioned under the solar cells 1, a pattern forming part 50*a* positioned under the insulating sheet 30, a lower protective layer 20*b*1 positioned under the pattern forming part 50*a*, and a back sheet 53 positioned under the lower protective layer 20*b*1.

As described above, the insulating sheet 30 shown in FIGS. 10 and 11 has substantially the same operation and structure as the insulating sheet 30 shown in FIGS. 1 and 2, except that the insulating sheet 30 shown in FIGS. 10 and 11 is positioned directly under the solar cells 1.

As described above, the pattern forming part 50*a* electrically connects the plurality of solar cells 1 to one another and includes an insulating film 52*a* formed of an insulating material and a conductive pattern part 51 positioned on the insulating film 52*a*.

Thus, as shown in FIG. 11, because a conductive adhesive part 54 is positioned on the openings 31 of the insulating sheet 30, as described above with reference to FIGS. 1 to 9, the front electrode current collectors 161 and the back electrode current collectors 162 of the solar cell 1 are connected to the front electrode patterns 511 and the back electrode patterns 512 of the conductive pattern part 51 through the conductive adhesive part 54. Hence, the electrical connection between the plurality of solar cells 1 is performed.

Configuration of the conductive pattern part 51 of the pattern forming part 50*a* is substantially the same as the conductive pattern part 51 of the pattern forming part 50 shown in FIGS. 1 and 2.

Because the lower protective layer 20*b*1 is positioned under the pattern forming part 50*a* used to electrically connect the solar cells 1 to one another, the lower protective layer 20*b*1 does not include a plurality of openings unlike the lower protective layer 20*b* shown in FIGS. 1 and 2. Thus, the shapes of the upper protective layer 20*a* and the lower protective layer 20*b*1 shown in FIGS. 10 and 11 are substantially the same as each other. The lower protective layer 20*b*1 shown in FIGS. 10 and 11 is formed of the same material as the lower protective layer 20*b* shown in FIGS. 1 and 2 and performs the same operation as the lower protective layer 20*b* except the above structural difference.

The back sheet 53 prevents the moisture from penetrating into a back surface of the solar cell module 100*a*, thereby protecting the plurality of solar cells 1 from an external environment, in the same manner as the back sheet 52 shown in FIGS. 1 and 2. The back sheet 53 is formed of an insulating material such as fluoropolymer/polyester/fluoropolymer (FP/PE/FP).

Figure 12:
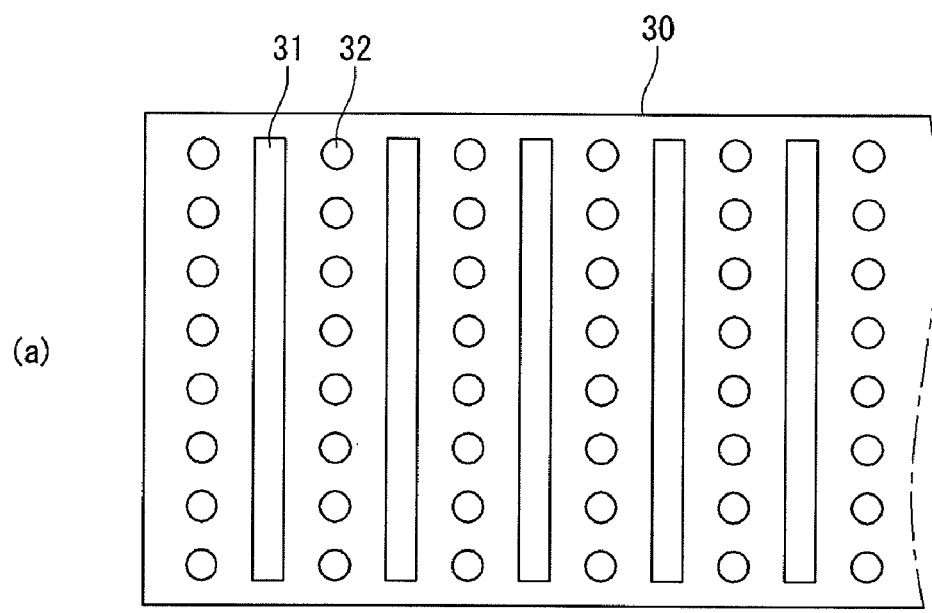
FIGS. 12 and 13 are plane views schematically showing various configurations of an insulating sheet of the solar cell module shown in FIG. 10.
Figure 12:
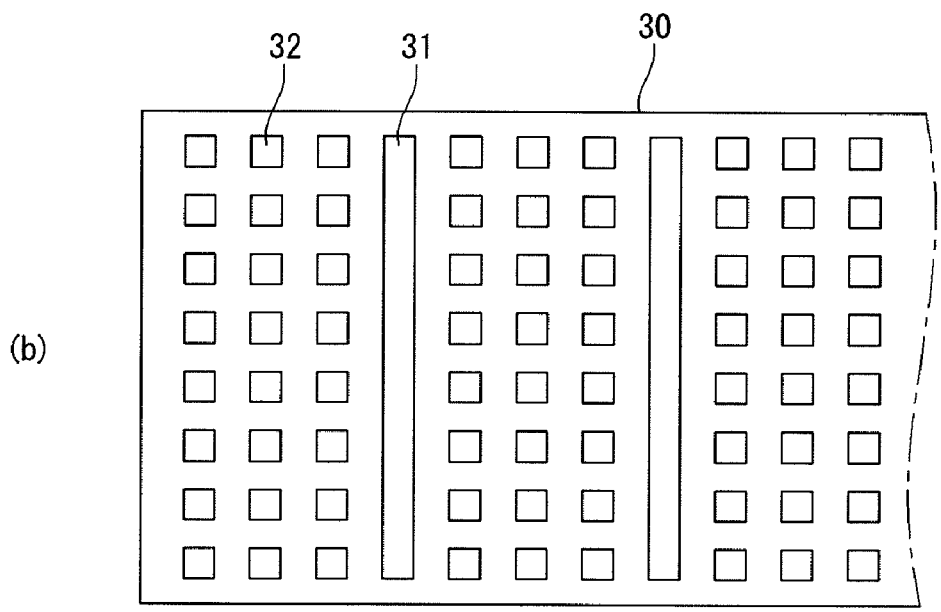

However, as shown in (a) of FIG. 12 and (b) of FIG. 12, the insulating sheet 30 has a plurality of holes 32 as well as a plurality of openings 31 exposing the front electrode current collectors 161 and the back electrode current collectors 162. Namely, the insulating sheet 30 has a porous pattern.

A cross-sectional shape of each hole 32 shown in (a) of FIG. 12 is a circle, but may also have various shapes such as a polygon or an oval, for example. Further, the holes 32 may be formed at a uniform distance therebetween or at a non-uniform distance therebetween. Diameters of the holes 32 may be substantially equal to one another. Alternatively, at least two of the diameters of the holes 32 may be different from the other diameters.

As shown in (b) of FIG. 12, when the cross-sectional shape of each hole 32 is a rectangle, the insulating sheet 30 may have a net-shaped pattern.

Figure 13:
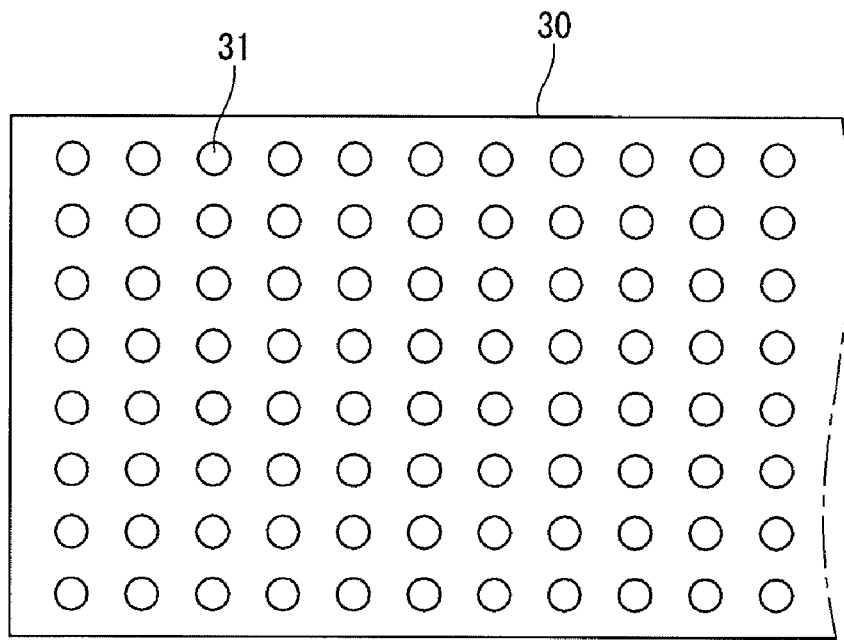
Figure 13:
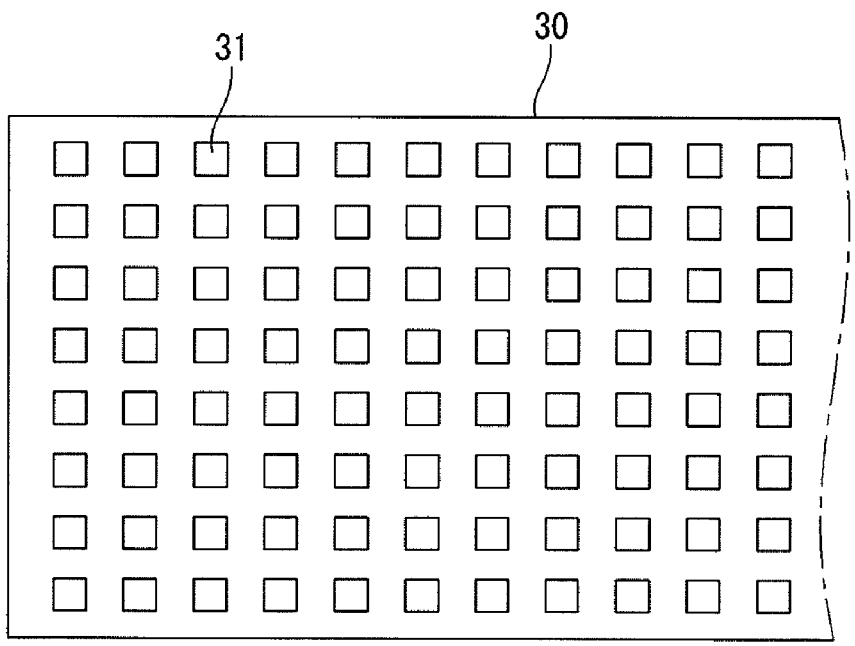

As shown in (a) of FIG. 12 and (b) of FIG. 12, the plurality of openings 31 exposing the front electrode current collectors 161 and the back electrode current collectors 162 have a stripe shape. However, as described above with reference to FIG. 8, the cross-sectional shape of each opening 31 may be a circle, a polygon, or an oval, for example. The openings 31 may have the structure in which a plurality of holes 211 are arranged along the current collectors 161 and 162. In this instance, the insulating sheet 30 may have a pattern shown in FIGS. 13(a) and 13(b).

The insulating film 52a may have a porous pattern in the same manner as the insulating sheet 30. In this instance, because the insulating film 52a does not have a plurality of openings (for example, openings 21 or 31) exposing the front electrode current collectors 161 and the back electrode current collectors 162, a plurality of holes 32 are formed on the entire surface of the insulating film 52a in a fixed pattern. An example where the insulating film 52a has the porous pattern may be substantially the same as the pattern illustrated in (a) of FIG. 13 and (b) of FIG. 13.

Figure 14:
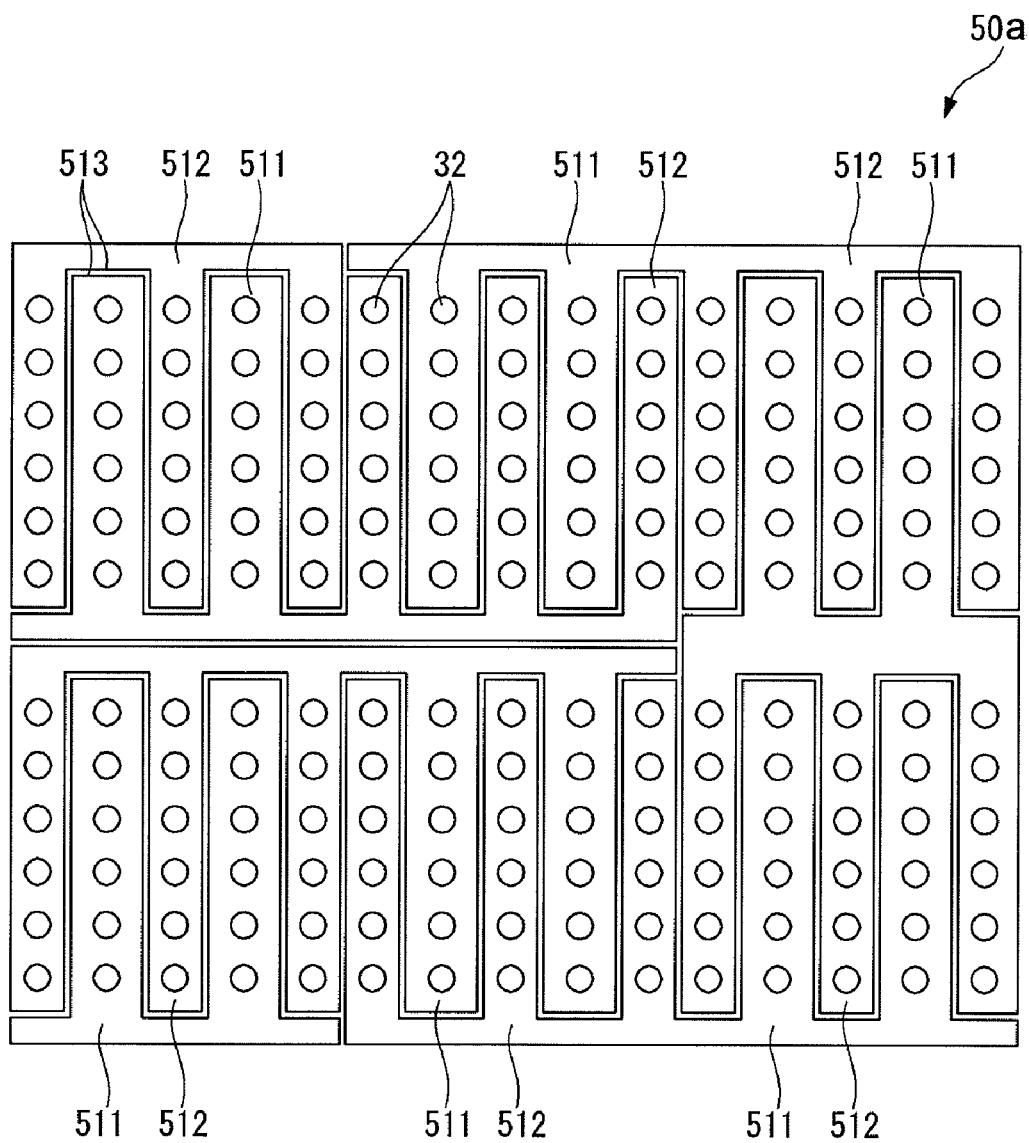
FIGS. 14 and 15 are plane views schematically showing various configurations of a conductive pattern part of the solar cell module shown in FIG. 10.
Figure 15:
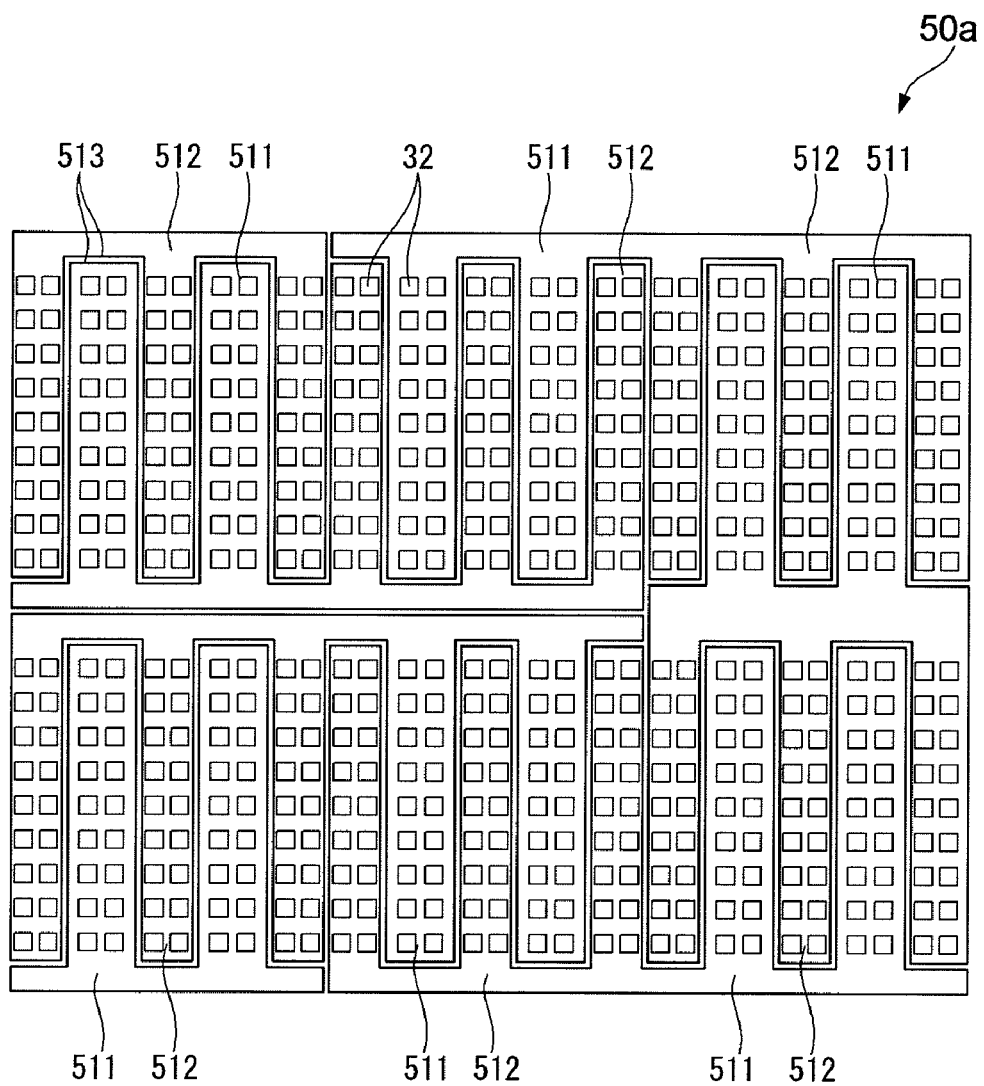

Further, the conductive pattern part 51 may have a porous pattern having a plurality of holes 32. An example where the conductive pattern part 51 has the porous pattern is illustrated in FIGS. 14 and 15. As described above, the shape of the holes 32 may be an oval, a polygon, or a circle. Distances between the holes 32 may be substantially equal to or different from one another, and diameters of the holes 32 may be substantially equal to or different from one another.

As above, when at least one of the insulating sheet 30, the insulating film 52a, and the conductive pattern part 51 has the porous pattern having the plurality of holes 32, the upper and lower protective layers 20a and 20b1 may be melted because of heat generated when the lamination process is performed to form one protective member, and the one protective member thus formed may surround the plurality of solar cells 1. In this instance, because the formation material of the lower protective layer 20b1 smoothly moves to the plurality of solar cells 1 through the plurality of holes 32, the upper and lower protective layers 20a and 20b1 may stably and easily perform a sealing operation.

The insulating film 52a and the conductive pattern part 51 of the pattern forming part 50a may be manufactured to form an integral body in the same manner as the pattern forming part 50, or may be manufactured as a separated part.

Further, FIG. 11 shows the conductive adhesive part 54 positioned on the insulating sheet 30, whereby the conductive adhesive part 54 may be then positioned on the insulating sheet 30 and the conductive pattern part 51. When the conductive adhesive part 54 is positioned on the conductive pattern part 51, the conductive adhesive part 54 may be positioned at a location corresponding to the openings 31 of the insulating sheet 30.

As described above, in the solar cell module 100a according to the embodiment of the invention, the electrical connection between the plurality of solar cells 1 is easily and rapidly performed because of the pattern forming part 50a having the conductive pattern part 51.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module, comprising:
a plurality of solar cells, each solar cell including at least one first current collector and at least one second current collector, and the at least one first current collector and the at least one second current collector being positioned on a non-light incident surface of each solar cell, which is opposite to a light incident surface of each solar cell;
a first protective layer positioned on the light incident surfaces of the plurality of solar cells;
a transparent member positioned on the first protective layer;
a conductive pattern part positioned on the non-light incident surfaces of the plurality of solar cells, the conductive pattern part including a first pattern having at least one first protrusion, a second pattern having at least one second protrusion, a third pattern having at least one third protrusion, and a fourth pattern having at least one fourth protrusion, wherein the first pattern being spaced apart from the second pattern and the third pattern being spaced apart from the fourth pattern, and the second pattern being connected to the third pattern; and
an insulating sheet positioned between the plurality of solar cells and the conductive pattern part and having a plurality of first openings positioned at locations corresponding to the first and second current collectors of the plurality of solar cells and exposing the first and second current collectors of the plurality of solar cells,
wherein the at least one first current collector of one solar cell is connected to the at least one first protrusion of the first pattern through the first openings of the insulating sheet, the at least one second current collector of another solar cell is connected to the at least one fourth protrusion of the fourth pattern through the first openings of the insulating sheet, the at least one second current collector of the one solar cell is connected to the at least one second protrusion of the second pattern through the first openings of the insulating sheet, and the at least one first current collector of the another solar cell is connected to the at least one third protrusion of the third pattern through the first openings of the insulating sheet.

2. The solar cell module of claim 1, wherein a ratio of an area of the first and third patterns to an area of the second and fourth patterns is 0.6 to 1:1 to 0.6.

3. The solar cell module of claim 1, wherein the first pattern and the second pattern are separated from each other by an insulating material and the third pattern and the fourth pattern are separated from each other by the insulating material.

4. The solar cell module of claim 1, further comprising a back sheet positioned under the conductive pattern part.

5. The solar cell module of claim 1, further comprising a second protective layer positioned between the plurality of solar cells and the insulating sheet.

6. The solar cell module of claim 5, wherein the second protective layer has a plurality of second openings exposing the first and second current collectors of the plurality of solar cells.

7. The solar cell module of claim 4, further comprising a second protective layer positioned between the conductive pattern part and the back sheet.

8. The solar cell module of claim 7, wherein the insulating sheet further has a plurality of holes formed in a portion where the plurality of first openings are not positioned.

9. The solar cell module of claim 7, further comprising an insulating film positioned between the conductive pattern part and the second protective layer.

10. The solar cell module of claim 9, wherein the insulating film has a plurality of holes.

11. The solar cell module of claim 7, wherein the conductive pattern part has a plurality of holes.

12. The solar cell module of claim 1, wherein each of the first to fourth protrusions has a curved edge.

13. The solar cell module of claim 1, wherein the first to fourth protrusions and the first and second current collectors are connected by a conductive adhesive part that is positioned between the first and second current collectors and the first and fourth protrusions.

14. The solar cell of claim 13, wherein the conductive adhesive part is formed of a conductive adhesive film, a conductive paste, or a conductive epoxy.

15. The solar cell module of claim 14, wherein the conductive adhesive film includes a resin and conductive particles distributed in the resin.

16. The solar cell module of claim 15, wherein the resin is a thermosetting resin.

17. The solar cell module of claim 15, wherein each of the conductive particles has a diameter of about 2 um to 30 μm.

18. The solar cell of claim 1, wherein the at least one first current collector has a plurality of first current collectors that are spaced apart from each other and the at least one second current collector has a plurality of second current collectors that are spaced apart from each other, each of the plurality of first current collectors and each of the plurality of second current collectors being alternately positioned on the non-light incident surface of each solar cell, and the first pattern having a plurality of first protrusions connected to a plurality of first current collectors of one solar cell, the second pattern having a plurality of second protrusions connected to a plurality of second current collectors of the one solar cell, a third pattern having a plurality of third protrusions connected to a plurality of first current collectors of another solar cell, and a fourth pattern having a plurality of fourth protrusions connected to a plurality of second current collectors of the another solar cell.

19. The solar cell of claim 1, wherein a width of each first opening is less than a width of each of first to fourth protrusions.

* * * * *